United States Patent [19]
Yoshimura et al.

[11] Patent Number: 6,159,350
[45] Date of Patent: Dec. 12, 2000

[54] MAGNETRON SPUTTERING APPARATUS AND MASK

[75] Inventors: Yoshinori Yoshimura; Masaaki Iwasaki, both of Shizuoka, Japan

[73] Assignee: Sony Disc Technology Inc., Tokyo, Japan

[21] Appl. No.: 08/371,227

[22] Filed: Jan. 11, 1995

[30] Foreign Application Priority Data

Jan. 19, 1994 [JP] Japan .................................. 6-003950

[51] Int. Cl.$^7$ .................................................. C23C 14/34
[52] U.S. Cl. ................... 204/298.11; 204/298.09; 204/298.14; 204/298.19; 204/298.2; 204/298.23
[58] Field of Search ..................... 204/298.09, 298.11, 204/298.12, 298.14, 298.15, 298.16, 298.17, 298.19, 298.2, 298.23, 298.25, 298.26, 298.27, 298.28, 298.29; 118/720, 721, 504, 505

[56] References Cited

U.S. PATENT DOCUMENTS

| | | | |
|---|---|---|---|
| 4,469,719 | 9/1984 | Martin | 427/255.5 |
| 4,886,592 | 12/1989 | Anderle et al. | 204/298.25 |
| 4,943,363 | 7/1990 | Zejda et al. | 204/298.11 |
| 5,112,467 | 5/1992 | Zejda | 204/298.11 |
| 5,164,063 | 11/1992 | Braeuer et al. | 204/298.2 |
| 5,174,880 | 12/1992 | Bourez et al. | 204/298.17 |
| 5,254,236 | 10/1993 | Kinokiri et al. | 204/298.11 |

FOREIGN PATENT DOCUMENTS

| | | | |
|---|---|---|---|
| 0 229 914 | 7/1987 | European Pat. Off. | C23C 14/04 |
| 0 229 914 | 9/1987 | European Pat. Off. | C23C 14/04 |
| 0 496 036 A1 | 7/1992 | European Pat. Off. | C23C 14/56 |
| 0 512 296 A1 | 11/1992 | European Pat. Off. | H01L 21/90 |
| 39 19147 A1 | 12/1990 | Germany | C23C 14/35 |
| 5-78833 | 3/1993 | Japan | 204/298.11 |
| 2 235 808 | 3/1991 | United Kingdom | G11B 7/26 |

OTHER PUBLICATIONS

WPI Abstract Accession No. 86–179686/28 & JP 61113141 A (Toshiba).

*Primary Examiner*—Rodney McDonald
*Attorney, Agent, or Firm*—Limbach & Limbach LLP

[57] ABSTRACT

A magnetron sputtering apparatus for forming a thin metal film on one of the major surfaces of a light-transmitting disc-shaped substrate as a disc substrate for an optical disc as mutually intersecting magnetic fields are applied by a magnetic field application unit provided at back of a target. The apparatus includes a center mask tightly contacted with the outer peripheral portion of one major surface of the disc substrate on which the thin film is formed for masking the center portion of the substrate and an outer peripheral mask tightly contacted with the outer peripheral portion of the one major surface of the disc substrate on which the thin film is formed for masking the outer peripheral portion. The outer peripheral mask is separated from and independent of the center mask.

4 Claims, 4 Drawing Sheets

MAGNETRON SPUTTERING APPARATUS AND MASK

BACKGROUND

1. Field of the Invention

The present invention relates to a magnetron sputtering apparatus. More particularly, the present invention relates to a magnetron sputtering apparatus employing a mask intimately affixed to a film-forming surface.

2. Background of the Invention

Optical discs, such as so-called Compact Discs (CDs), have come into widespread use for recording digital audio informations or video informations. Such optical disc has a substrate of a transparent synthetic resin, such as polycarbonate, on the surface of which a thin film layer of aluminum (Al) of high reflectivity is formed by vapor deposition or sputtering. On the surface of the substrate carrying the Al thin film layer is formed a pattern of micro-sized lands and recesses, termed pits, corresponding to the digital information of "1" or "0". The light beam is radiated on these pits through the substrate and the information recorded on the optical disc is read on the basis of the reflected light beam from the thin film layer.

Since a thin film can be formed on an optical disc substrate within a shorter time, an apparatus shown in FIG. 1 is employed for continuously sputtering plural discs one by one.

FIG. 1 shows only the essential mechanism of such magnetron sputtering apparatus. In FIG. 1, substrates 102, 102, . . . of optical discs, such as CDs, are transported in succession by an external transporting mechanism 101, such as a belt conveyor. The substrates 102, 102 thus transported are sucked by a suction pad 104 of a disk-shaped transporting device 103, rotatable about its axis and movable between an upward direction and a downward direction, and are transported in this state into a sputtering chamber 105.

The substrate 102, transported by the suction pad 104, is set in the sputtering chamber 105 on a transporting table 106 which is similarly rotatable about its axis and movable in the upward direction and the downward direction. The substrate 102, set on the transporting table 106, is transported to a position facing a sputtering source 107 by the rotation and vertical movement of the transporting table 106. Film spatter is carried out by the sputtering source 107 on the substrate 102 mounted opposing the sputtering source 107. Following the film sputter, the substrate 102 is again set on the transporting table 106 and taken out to outside by the transporting device 103.

The substrate 102, transported into the sputtering chamber 105, is moved in the upward direction by the transporting table 106 into intimate contact with the lower end face of a mask 108 provided within the sputtering source 107, as shown to an enlarged scale in FIG. 2. A film-forming chamber 109, in which the film sputter is carried out by sputtering, includes anti-sputter shields 112a, 112b and the mask 108 mounted on the inner wall surface of an outer enclosure 110. If there is no substrate 102 in the film-forming chamber 109, the inside of the film-forming chamber 109 is evacuated via a space 111 in the mask 108 by a vacuum pump, not shown.

The substrate 102, transported by the transporting table 106, is supported by the mask 108, and yet has its non-film-forming portion shielded by the mask 108. The mask 108 is fabricated to high precision and intimately bonded and secured to the outer enclosure 110 by utilizing its force of thermal expansion. An Al target 113 is secured to a target cooling plate 114 for constituting a cathode electrode and supplies a magnetic field in the film-forming chamber 109 in cooperation with a magnet 115. The magnet 115 is mounted for being rotated at a position offset from the center of the film-forming chamber 109 and is adapted for supplying a more uniform magnetic field for improving the exploitation efficiency of the target 113.

The cathode electrode induces a discharge electrical field on the order of 75 (W/cm$^2$) on the target surface. In order to suppress the temperature on the target 113 during film formation to not higher than 200 to 300 (° C.), a ring-shaped hollow space is formed within the inside of the target cooling plate 114 so as to be supplied with the cooling water via a water supply pipe 116. The inside of the film-forming chamber 109 is supplied an argon gas required fir film sputter through a gas inlet tube 117. The pressure during film formation is in a range of 0.2 to 5.0 (Pa). Since the magnetron sputtering apparatus is used under different operating conditions from one user to another, the internal pressure is known to be varied over an extensive range as described above.

With the above-described magnetron sputtering apparatus, the Al target 113 is struck by argon gas atoms to produce a sputtering action to form an Al film on the surface of the substrate 102. After the film sputter, ejection of argon gas atoms ceases, and the substrate 102 is again placed on the transporting table 106 so as to be taken out by the transporting device 103.

With the above-described magnetron sputtering apparatus, a film sputtered on the substrates 102, 102 . . . transported thereto in succession occurs at a short cycle of about 6 seconds per substrate. Consequently, the time necessary for actual film formation is an extremely short period on the order of two seconds during which the electrical field is supplied to the Al target 113.

It is however not possible with the mask 108 now in use to form a film on all surface of the substrate 102, as shown in FIGS. 3 and 4. The reason is that four pillars 120 are provided for interconnecting a central mask portion 118 for masking the central portion of the substrate 102 and an outer peripheral mask portion 119 for masking the outer peripheral portion of the substrate, as shown in FIGS. 3 and 4. That is, since these pillars 120 are provided on the surface of the substrate 102 to be sputtered, atoms or molecules struck out of the target 113 are screened by these pillars 120, as a result of which the thin film is not formed on the all surface of the substrate.

SUMMARY OF THE INVENTION

It is therefore an object of the present invention to provide a magnetron sputtering apparatus which resolves the above-mentioned problems.

It is another object of the present invention to provide a magnetron sputtering apparatus which resolves the above-mentioned problems.

According to the present invention, there is provided a magnetron sputtering apparatus for forming a thin metal film on one of the major surfaces of a light-transmitting disc-shaped substrate as a disc substrate for an optical disc as mutually intersecting magnetic fields are applied by a magnetic field application unit provided at back of a target. The apparatus includes a center mask and an outer mask. The center mask is tightly contacted with the central portion of one major surface on which the thin film is formed for masking the center portion of the substrate. The outer peripheral mask is tightly contacted with the outer peripheral portion of the one major surface on which the thin film is formed for masking the outer peripheral portion of the substrate. The outer peripheral mask is separated from and independent of the center mask.

According to the present invention, there is provided a magnetron sputtering apparatus including a target, a target cooling unit, a magnetic field application unit, a center mask, an outer peripheral mask, and a substrate holding unit. The target forms a thin film on one of the major surfaces of a disc-shaped substrate. The target cooling unit is mounted on the opposite side of the target for cooling the target. The magnetic field application means is arranged at back of the target for applying mutually intersecting magnetic fields. The center mask is mounted in an insulated state on the target cooling unit and tightly contacted with the central region of the major surface of the substrate on which the thin film is formed and masks the central region. The outer peripheral mask is mounted at a stationary portion of the film forming chamber and tightly contacted with the outer peripheral region of the major surface of the substrate on which the thin film is formed and masks the outer peripheral region. The outer peripheral mask is provided independently of the center mask. The substrate holding unit causes the substrate to be moved vertically in a direction toward and away from the center mask and the outer peripheral mask.

According to the present invention, there is provided a mask employed for forming a film by sputtering on a disc-shaped substrate. The mask includes a center mask, an outer peripheral mask and a separating portion. The center mask is tightly contacted with the central portion of one of the major surfaces of the substrate on which the thin film is formed and masks the central portion. The outer peripheral mask is tightly contacted with the outer peripheral portion of one of the major surfaces of the substrate on which the thin film is formed and masks the outer peripheral portion. The central portion of the outer peripheral mask is formed with a circular opening within which the center mask is arranged. The separating portion is formed between the center mask and the inner rim of the opening in the outer peripheral mask over the entire inner rim of the opening for extending along the entire thickness of the mask. The center mask and the outer peripheral mask are independent of each other via the separating portion.

According to the present invention, since the outer peripheral mask is provided independently of the center mask, and hence there is no impediments in the mask possibly obstructing atoms ejected form the target, it becomes possible to form a film on all surface of the substrate.

DESCRIPTION OF THE INVENTION

Figure 1:
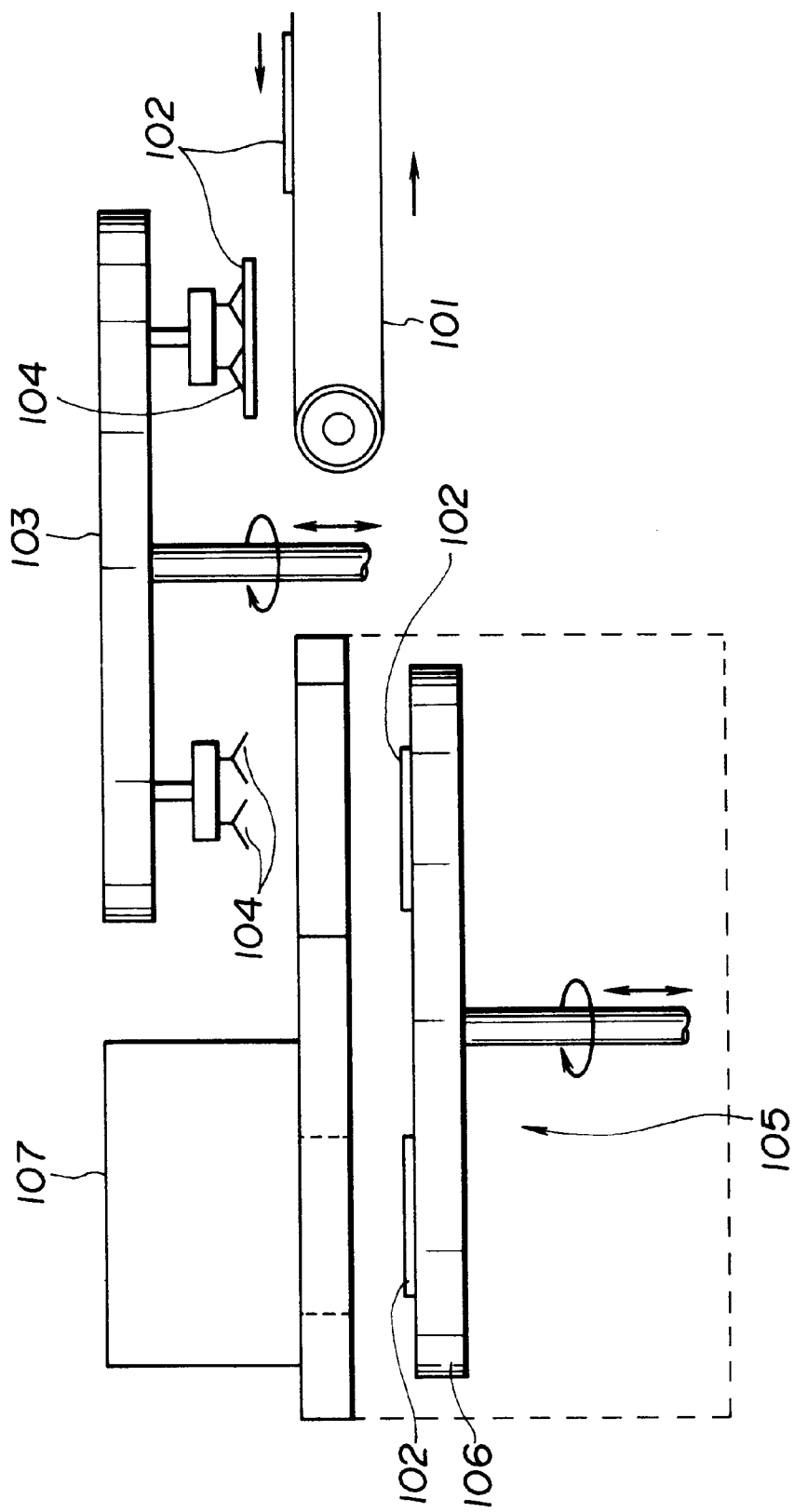
FIG. 1 is a front view showing an arrangement of a continuous sputtering apparatus.

Referring to the drawings, preferred embodiments of the present invention will be explained in detail.

Figure 5:
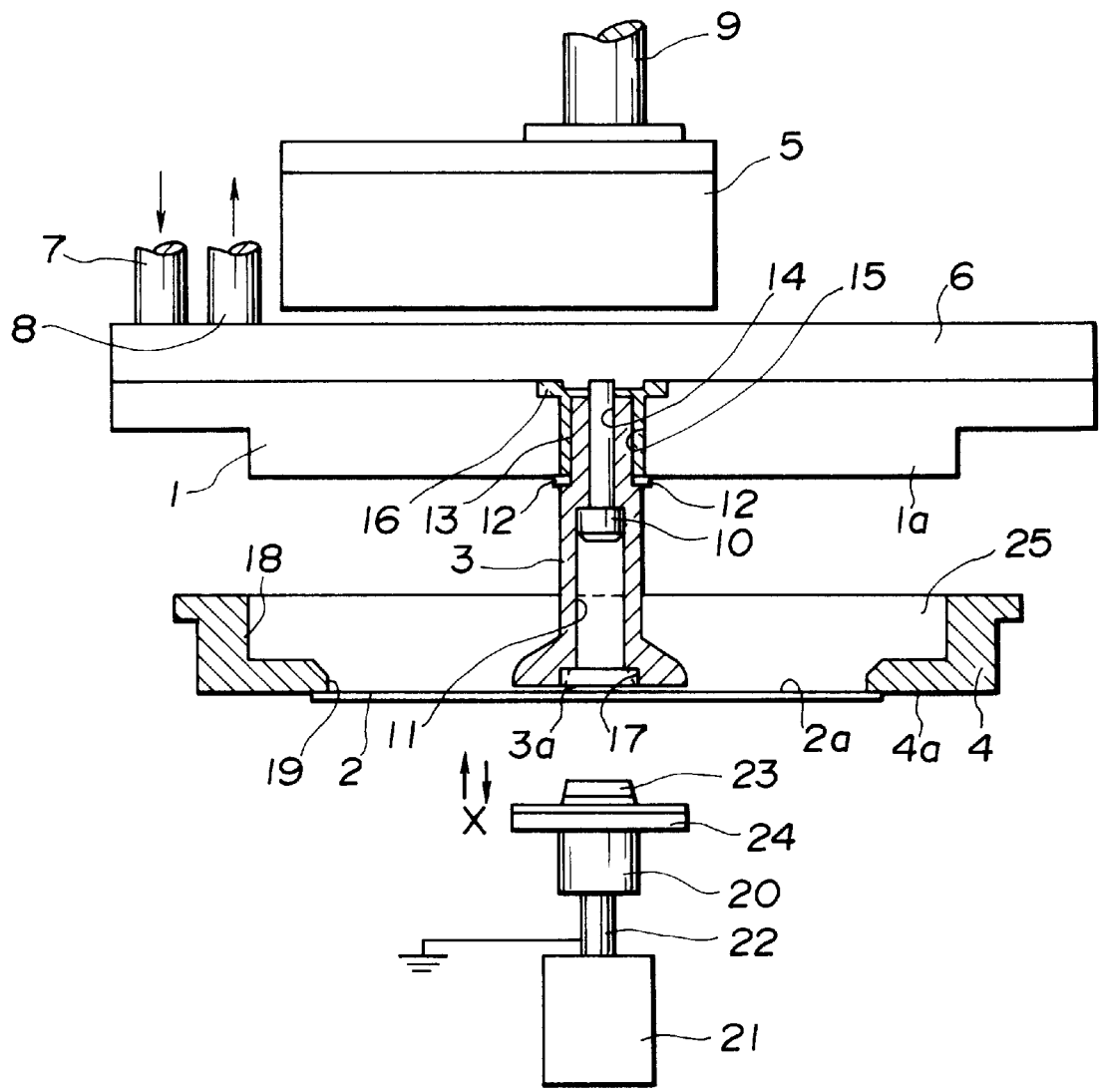
FIG. 5 is a front view of a magnetron sputtering apparatus embodying the present invention, with a portion thereof being broken away.

The magnetron sputtering apparatus according to the present invention is mainly composed of a target 1, a center mask 3 and an outer peripheral mask 4 for masking pre-set portions of a disc-shaped substrate 2, and a magnet 5 for applying mutually intersection electric and magnetic fields, as shown in FIG. 5. The disc substrate 2, used herein, is formed of a light transmitting material, and has micro-sized recesses and lands, that is pits, corresponding to the information signals.

The target 1, functioning as the cathode electrode, is used for forming a thin film on the surface of the disc substrate 2 carrying the pits, that is the surface of the disc substrate to be sputtered. For fabricating an optical disc, the target 1 formed of aluminum is employed. The target 1 is formed as a disc larger in diameter than the disc substrate 2 and has a reduced thickness only at its outer peripheral portion. That is, the target is formed as a disc having a protruded central portion facing the disc substrate 2.

On the surface of the target 1 opposite to its target surface 1a struck by atoms, such as argon atoms, there is provided a target cooling device 6 for cooling the target 1. The target cooling device 6 is in the form of a disc having an outer diameter substantially equal to the outer diameter of the target 1.

The target cooling device 6 has a hollow duct, at a mid portion of the plate thickness thereof for circulation of the cooling water therein. To an inlet and an outlet of the hollow duct for circulation of cooling water are connected a cooling water supply pipe 7 for supplying fresh cooling water and a cooling water discharge pipe 8 for discharging the water circulated through the duct, respectively.

Thus the cold water introduced via the cooling water supply pipe 7 is circulated through the cooling water circulating duct of the target cooling device 6 and, after cooling the target 1 mounted in contact with the target cooling device 6, is discharged via the cooling water discharge pipe 8. This prevents the temperature from being increased during sputtering.

The magnet 5 applies mutually intersecting electrical and magnetic fields on atoms striking the target 1 under the argon gas atmosphere. The magnet 5 is mounted at a rearward offset portion with respect to the distal end of a rotary shaft 9 on the opposite side of the target 1 with the target cooing device 6 in-between. Thus the applied magnetic field is rendered uniform as the magnet performs offset rotation, thereby improving the exploitation efficiency of the target 1.

The center mask 3 is used for masking the central portion of the disc substrate 2, and is adapted for holding the substrate 2 by being intimately contacted with its central portion. Such center mask 3 has the shape of a flared cylinder having a larger diameter on the side thereof contacted with the disc substrate 2.

Along the center axis of the center mask 3 is formed a through-hole 11 adapted to be passed through by a bolt 10 insulatingly processed or formed of an insulating material for securing the center mask 3 to the target cooling device 6. On the opening end of the through-hole 11 is formed a fitting portion 17 adapted to be contacted with a disc centering member as later described and with the center mask 3. The fitting portion 17 is formed as a recess in which the disc centering member has a fit.

If the bolt 10 is formed of an insulating material, it may be ceramics, plastics or polytetrafluoroethylene (PTFE).

The portion of the center mask 3 introduced into the target 1 is of a slightly reduced diameter to form a step surface.

Between the step surface and the target surface 1a is interposed a annular spacer 12 which is insulatingly processed or made of an insulating material for insulation between the target 1 and the center mask 3. If such spacer 12 is formed of an insulating material, the same insulating material as that of the bolt 10 may be employed.

On the outer perimeter of the smaller diameter portion of the center mask 3 is fitted a holder 13 which is insulatingly processed or formed of an insulating material for insulating the center mask 3 with respect to the target 1 and the target cooling device 6. The holder 13, which is formed of a bottomed cylinder fitted on the smaller-diameter portion of the center mask 3 and opened on one end, is fitted into a holder mounting hole 15 bored at the center of the target 1. If such holder 13 is formed of an insulating material, the same insulating material as that of the spacer 12 may be employed.

In the bottom surface of the holder 13 is formed a circular bolt-inserting opening 14 passed through by the distal end of the bolt 10 passed through the through-hole 11 of the center mask 3. The bottom side of the center mask 3 is formed with a flange 16 for preventing the holder 13 from being detached from the mounting hole 15 when the holder 13 is fitted in the mounting hole 15.

Figure 2:
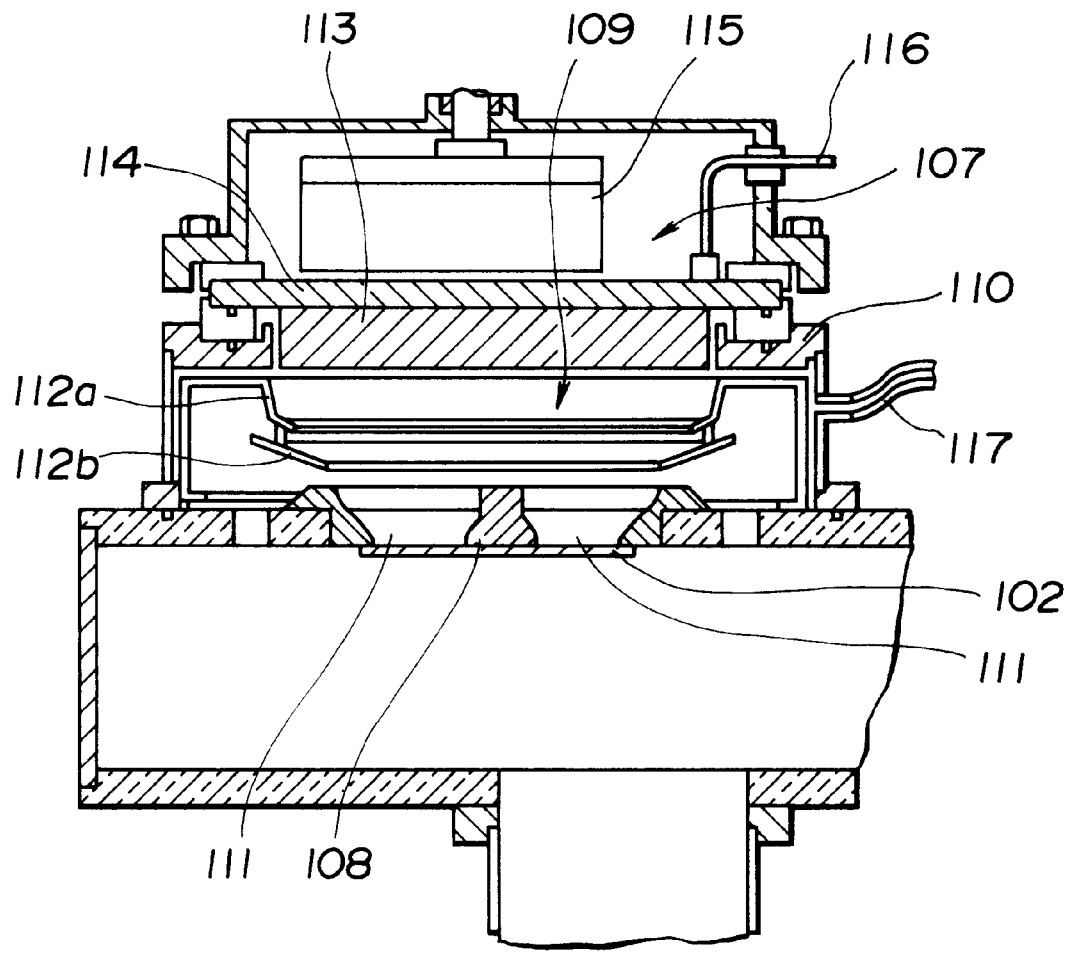
FIG. 2 is an enlarged cross-sectional view showing the continuous sputtering apparatus shown in FIG. 1.
Figure 3:
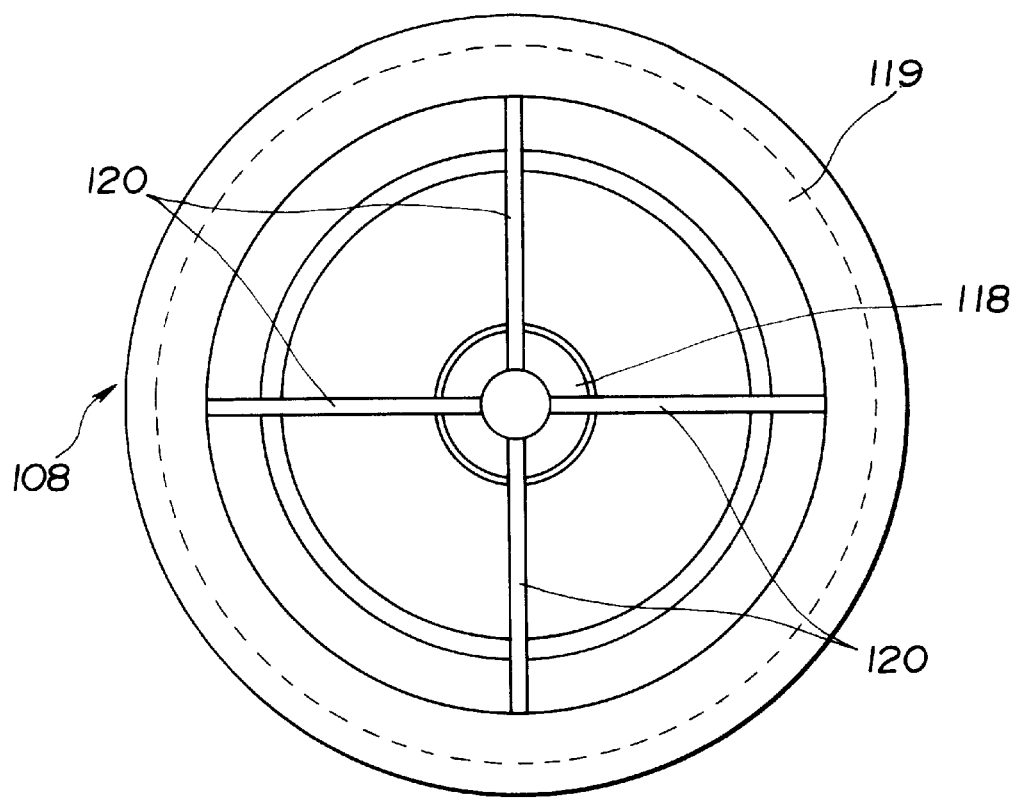
FIG. 3 is a plan view showing a mask.
Figure 4:
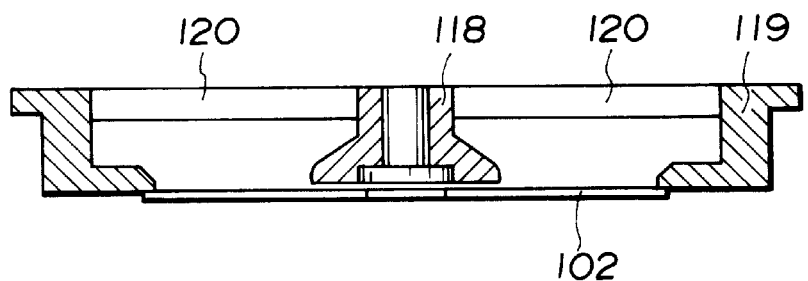
FIG. 4 is a cross-sectional view of the mask shown in FIG. 3.

The outer peripheral mask 4 plays the role of masking the outer peripheral portion of the disc substrate 2 by being intimately contacted with such outer peripheral portion and is mounted on an outer enclosure constituting the film-forming chamber, not shown herein and shown in FIG. 2, independently of the center mask 3. The outer peripheral mask 4 is formed as a disc having a blind hole 18 of the same size as the outer diameter of the protruding portion of the target 1 and a center hole 19 which is a circular through-hole having a diameter slightly smaller than the outside diameter of the disc substrate 2.

Between the inner wall surface of the center hole 19 of the outer peripheral mask 4 and the outer periphery of the free end of the center mask 3 formed with a contact surface 3a is formed a void 25 in the direction of the thickness of the masks 3 and 4 over the entire periphery of the inner wall surface of the center hole 19, as shown in FIG. 5. The outer peripheral mask 4 and the center mask 3 are completely separated and isolated from each other by the void 25. It is via this void 25 that atoms from the target 1 are sputtered on the substrate 2. A contact surface 4a of the outer peripheral mask 4, adapted to be intimately contacted with the outer peripheral portion of the disc substrate 2, is flush with the contact surface 3a of the center mask 3 for maintaining the disc substrate 2 in a horizontal position and for forming a uniform film by sputtering.

The disc substrate 2 is tightly contacted with the contact surfaces 3a of the center mask 3 and with the contact surface 4a of the outer peripheral mask 4 by a substrate holding unit 20. The substrate holding unit 20 is mounted at the distal end of a shaft 22 of a cylinder 21 adapted for setting the disc substrate 2 thereon and for vertically moving the disc substrate 2 in directions towards and away from the center mask 3 and the outer peripheral mask 4 as indicated by arrows X. The substrate holding unit 20 is maintained at an anodic potential by means of a shaft 22.

The substrate holding unit 20 has a disc centering member 23 adapted for being fitted in the circular through-hole formed at the center of the disc substrate 2 and a disc setting table 24 for supporting the centered disc substrate 2.

The disc centering member 23 is positioned for facing a through-hole formed at the center of the disc substrate 2 for centering the disc substrate 2, and is frusto-conically-shaped so as to be projected from the disc setting table 24 and so as to be gradually tapered towards its distal end. A disk-shaped disc setting table 24 for stably supporting the disc substrate 2 is provided on the proximal side of the disc centering member 23.

During sputtering, the disc substrate 2 is uplifted by the cylinder 21 in a state in which it is set on the disc setting table 24. The disc substrate 2, thus moved in an upward direction, has its central portion and outer peripheral portion tightly contacted by the center mask 3 and the outer peripheral mask 4, respectively. Thus the surface 2a of the disc substrate 2 to be sputtered is exposed in its entirety without being shielded by the masks 3 and 4, as a result of which the film formed on the surface to be sputtered 2a is of a uniform thickness.

At this time, the disc centering member 23 of the substrate holding unit 20 is fitted and contacted with the fitting portion 17 in the center mask 3, so that the center mask 3 is maintained at an anodic potential. The center mask 3 is positively isolated by the bolt 10, spacer 12 and the holder 13 with respect to the target 1 and the target cooling device 6 and hence is positively maintained at the anodic potential.

During sputtering, the center mask 3 is subjected to an elevated temperature. However, it is cooled by the target cooling device 6 via the bolt 10 and the holder 13 provided in contact with the target cooling device 6.

While the present invention has been described with reference to preferred embodiments, it is not limited to the details set forth therein and is intended to cover any modifications that come within the scope of the invention set forth in the following claims.

What is claimed is:

1. A magnetron sputtering apparatus comprising:
   a film-forming chamber;
   a target for forming a thin film on one of the major surfaces of a disc-shaped substrate;
   target cooling means mounted on the opposite side of said target and for cooling said target;
   magnetic field applying means arranged at back of said target and for applying mutually perpendicular magnetic fields;
   a center mask mounted on said target cooling means in an insulated state and contacted with the central portion of one of the major surfaces of the disc substrate on which the thin film is formed, and for masking the center portion of said substrate,
   an outer peripheral mask mounted at a stationary portion of the film-forming chamber and contacted with the outer peripheral portion of the one major surface of the substrate on which the thin film is formed, and for masking the outer peripheral portion, said outer peripheral mask being independent of said center mask;
   substrate holding means for vertically moving the substrate in a direction towards and away from said center mask and said outer peripheral mask; and
   an insulating member for insulating said center mask with respect to said target and said target cooling means; and wherein
   said center mask is anodized by being contacted with said substrate holding means during sputtering.

2. A magnetron sputtering apparatus according to claim 1, wherein said center mask has a center axis, a proximal end opposite to a contact surface with the substrate, said proximal end having an outer peripheral surface, and wherein said insulating member comprises an insulated fastener fastened to said target cooling means inserted into a through-hole formed along the center axis of said center mask and an insulated holder fitted to the outer peripheral surface of the proximal end of said center mask opposite to the contact surface thereof with the substrate.

3. A magnetron sputtering apparatus according to claim 1, wherein said center mask has a center axis, a proximal end opposite to a contact surface with the substrate, said proximal end having an outer peripheral surface, and, wherein said insulating member comprises a first insulator inserted in a through-hole formed along the center axis of said center mask so as to be fastened to said target cooling means and a second insulator fitted to the outer peripheral surface of the proximal end of said center mask opposite to the contact surface thereof with the substrate.

4. A magnetron sputtering apparatus according to claim 2, wherein said center mask is cooled by said fastener, said holder and said substrate holding means.

* * * * *